(12) United States Patent  
Wu et al.

(10) Patent No.: US 8,049,209 B2  
(45) Date of Patent: Nov. 1, 2011

(54) THIN-FILM TRANSISTORS

(75) Inventors: Yiliang Wu, Mississauga (CA); Hualong Pan, Ottawa (CA); Ping Liu, Mississauga (CA); Yuning Li, Mississauga (CA); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 735 days.

(21) Appl. No.: 12/101,945

(22) Filed: Apr. 11, 2008

(65) Prior Publication Data

US 2009/0256139 A1 Oct. 15, 2009

(51) Int. Cl.
*H01L 35/24* (2006.01)
*H01L 51/00* (2006.01)
(52) U.S. Cl. ............ 257/40; 257/72; 257/E51.029
(58) Field of Classification Search .......... 257/40, 257/72, 188, E51.029
See application file for complete search history.

(56) References Cited

U.S. PATENT DOCUMENTS

2003/0227014 A1 12/2003 Murti  
2005/0287781 A1* 12/2005 Arias ............ 438/597

FOREIGN PATENT DOCUMENTS

CN 1807428 A 7/2006

OTHER PUBLICATIONS

Ong et al., "Thiophene polymer semiconductors for organic thin-film transistors", Chemistry—A European Journal 20080529 Wiley-VCH Verlag DE, vol. 14, No. 16, Mar. 25, 2008, pp. 4766-4778.  
European Search Report dated Jun. 9, 2009.

* cited by examiner

*Primary Examiner* — Hoai V Pham  
(74) *Attorney, Agent, or Firm* — Fay Sharpe LLP

(57) ABSTRACT

A thin film transistor having a semiconducting layer with improved flexibility and/or mobility is disclosed. The semiconducting layer comprises a semiconducting polymer and insulating polymer. Methods for forming and using such thin-film transistors are also disclosed.

17 Claims, 2 Drawing Sheets

THIN-FILM TRANSISTORS

BACKGROUND

The present disclosure relates, in various embodiments, to compositions, including semiconductor compositions, suitable for use in electronic devices, such as thin film transistors ("TFT"s). The present disclosure also relates to layers produced using such compositions and electronic devices containing such layers.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of a supporting substrate, three electrically conductive electrodes (gate, source and drain electrodes), a channel semiconducting layer, and an electrically insulating gate dielectric layer separating the gate electrode from the semiconducting layer.

It is desirable to improve the performance of known TFTs. Performance can be measured by at least three properties: the mobility, current on/off ratio, and threshold voltage. The mobility is measured in units of $cm^2/V \cdot sec$; higher mobility is desired. A higher current on/off ratio is desired. Threshold voltage relates to the bias voltage needed to be applied to the gate electrode in order to allow current to flow. Generally, a threshold voltage as close to zero (0) as possible is desired.

BRIEF DESCRIPTION

The present disclosure is directed, in various embodiments, to a thin film transistor having a semiconducting layer with improved performance. In particular, the semiconducting layer comprises a semiconducting polymer and an insulating polymer.

In embodiments, a thin-film transistor is disclosed comprising a gate dielectric layer and a semiconducting layer, the semiconducting layer comprising a semiconducting polymer and an insulating polymer.

The semiconducting polymer may have a crystallinity of greater than 50 percent. The semiconducting polymer may also have a melting point of 100° C. or higher, including 200° C. or higher.

The semiconducting polymer may be selected from the group consisting of polythiophenes, polythiophenes comprising unsubstituted thienylene groups, polythiophenes comprising optionally substituted thieno[3,2-b]thiophene and/or optionally substituted thieno[2,3-b]thiophene groups, polythiophenes comprising fused-ring aromatic groups selected from benzothiophene, benzodithiophene, and indolocarbazole, and polythiophenes comprising non-thiophene based aromatic groups including phenylene, fluorene, and furan, and the like.

In other embodiments, the semiconducting polymer may be selected from the group consisting of polymers A to D:

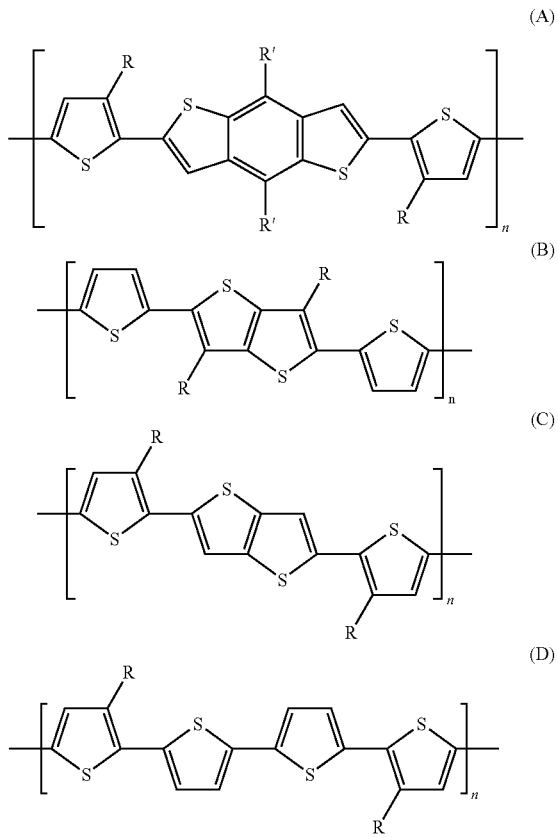

wherein R and R' are independently selected from hydrogen, alkyl or substituted alkyl containing from 1 to about 20 carbon atoms, a heteroatom-comprising group, and halogen; and n is a integer from about 3 to about 200.

In further embodiments, the insulating polymer may be selected from the group consisting of polystyrene, poly(α-methylstyrene), poly(4-vinyl biphenyl), poly(vinyl cinnamate), and polysiloxane.

The insulating polymer may have a weight average molecular weight of at least 2,000, including from about 5,000 to about 1,000,000.

In additional embodiments, the insulating polymer may comprise from about 0.1 to about 60 percent by weight of the semiconducting layer, including from about 0.1 to about 20 percent.

The semiconducting layer may be substantially homogeneous.

The transistor may have a mobility of 0.25 $cm^2/V \cdot sec$ or greater, and/or a threshold voltage of −10 V or greater.

The transistor may have a field effect mobility at least 10% higher, or at least 25% higher, than a transistor having the same semiconducting polymer but lacking the insulating polymer.

The semiconducting layer may have a yield point elongation at least 10% greater compared to a semiconducting layer having the same semiconducting polymer but lacking the insulating polymer. It may also have a yield point elongation equal to or greater than the yield point elongation of the gate dielectric layer. The yield point elongation of the semiconducting layer may also be from about 1% to about 25%.

In other embodiments, a thin-film transistor is disclosed, comprising:
a gate electrode, a source electrode, a drain electrode;
a semiconducting layer;
a gate dielectric layer;
the semiconducting layer and the gate electrode each being in direct contact with the semiconducting layer; and
the source electrode and drain electrode each being in direct contact with the semiconducting layer;
wherein the semiconducting layer comprises a semiconducting polymer and polystyrene.

In still further embodiments, a semiconductor composition is disclosed which comprises:
a solvent;
from about 0.1 to about 5 percent by weight of the composition of a crystalline semiconducting polymer; and
from about 0.01 to about 2.5 percent by weight of the composition of an amorphous insulating polymer;
wherein the composition has a viscosity from about 1.5 centipoise to about 20 centipoise.

The composition may have a viscosity of from about 2 centipoise to about 12 centipoise. The composition may have a viscosity at least 50% higher, or at least 100% higher, than a composition having the same amount of the crystalline semiconducting polymer but lacking the amorphous insulating polymer. The crystalline semiconducting polymer may have a weight average molecular weight of 50,000 or less. The insulating polymer may have a weight average molecular weight of 100,000 or greater.

In certain embodiments, the insulating polymer is polystyrene and the semiconducting polymer has the structure of

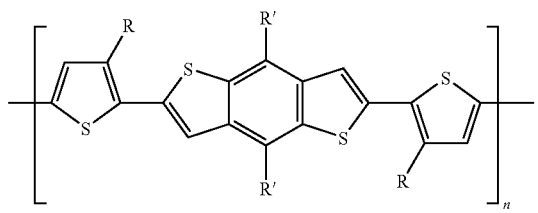

wherein R and R' are independently selected from alkyl or substituted alkyl containing from 1 to about 20 carbon atoms, a heteroatom-comprising group, and halogen; and n is a integer from about 3 to about 50.

In yet other embodiments, a process for forming a thin-film transistor is disclosed, comprising:
providing a substrate, a gate electrode, a gate dielectric layer, a source electrode, and a drain electrode; and
depositing a semiconductor composition comprising a solvent, a crystalline semiconducting polymer and an amorphous insulating polymer to form a substantially homogenous semiconducting layer comprising the semiconducting polymer and the insulating polymer upon the substrate;
wherein the semiconducting layer and the gate electrode each directly contact the semiconducting layer; and
wherein the source electrode and drain electrode each directly contact the semiconducting layer.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
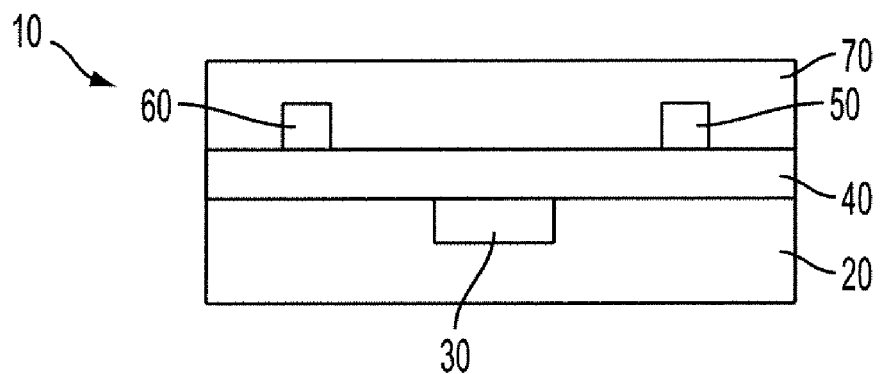
FIG. 1 is a first exemplary embodiment of an OTFT having the semiconducting layer of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first OTFT embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60.

Figure 2:
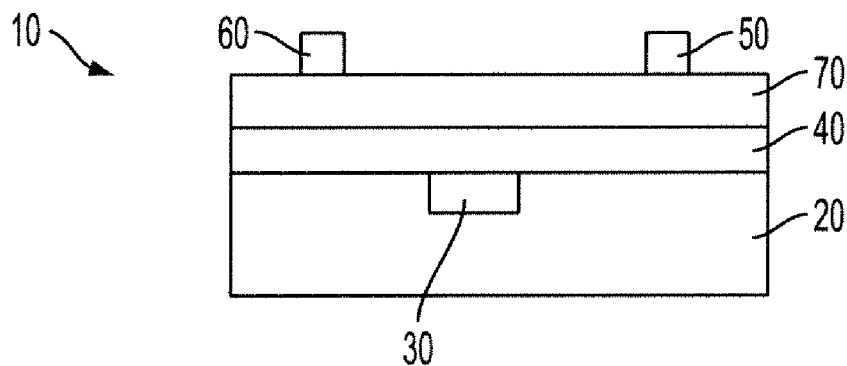
FIG. 2 is a second exemplary embodiment of an OTFT having the semiconducting layer of the present disclosure.

FIG. 2 illustrates a second OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60.

Figure 3:
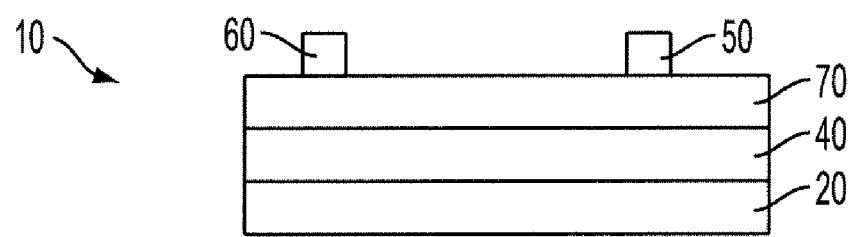
FIG. 3 is a third exemplary embodiment of an OTFT having the semiconducting layer of the present disclosure.

FIG. 3 illustrates a third OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60.

Figure 4:
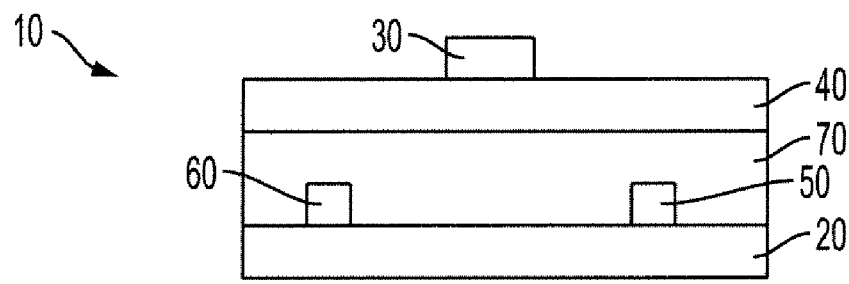
FIG. 4 is a fourth exemplary embodiment of an OTFT having the semiconducting layer of the present disclosure.

FIG. 4 illustrates a fourth OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70.

The semiconducting layer of the present disclosure comprises a semiconducting polymer and an insulating polymer. The addition of the insulating polymer provides several advantages, such as increasing the mobility, enhancing the flexibility, reducing the threshold voltage, and providing better saturation behavior.

The semiconducting polymer is generally is an organic p-type semiconductor. Exemplary semiconducting polymers include thiophene-based polymers, triarylamine polymers, polyindolocarbazoles, and the like. Thiophene-based polymers include, for example, both regioregular and regiorandom poly(3-alkylthiophene)s, polythiophenes, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups selected from benzothiophene, benzodithiophene, and indolocarbazole, and polythiophenes comprising non-thiophene based aromatic groups including phenylene, fluorene, and furan and the like. In further embodiments, the semiconducting polymer is a regioregular polythiophene. In certain embodiments, the semiconducting polymer is highly crystalline. In specific embodiments, the semiconducting polymer has a crystallinity of greater than 50 percent. In further specific embodiments, the semiconducting polymer has a crystallinity of greater than 80 percent, or greater than 90 percent. Crystallinity can be determined by methods such as X-ray diffraction.

The semiconducting polymer may have a weight average molecular weight of from about 1,000 to about 80,000, including from about 2,000 to about 50,000. In specific embodiments, the semiconducting polymer has a weight average molecular weight of 50,000 or less. The semiconducting polymer has a polydispersity from about 1.2 to about 4.0, including from about 1.2 to about 2.0. In specific embodiments, the semiconducting polymer has a polydispersity of 1.8 or less.

In other specific embodiments, the semiconducting polymer is a polythiophene. The semiconducting polymer may have a melting point of 100° C. or higher. In additional embodiments, the semiconducting polymer has a melting point of 200° C. or higher.

In additional embodiments, the semiconducting polymer is selected from the group consisting of polymers A to D:

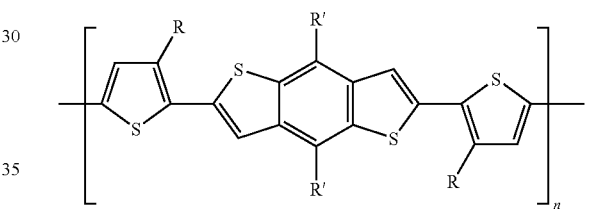

(A)

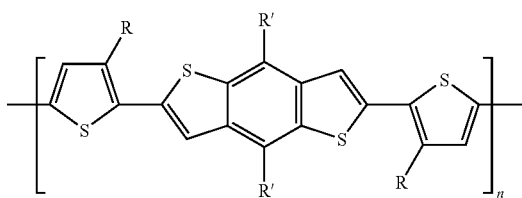

(B)

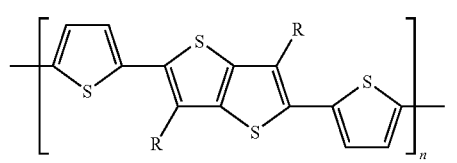

(C)

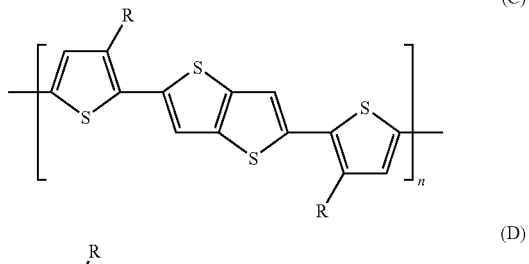

(D)

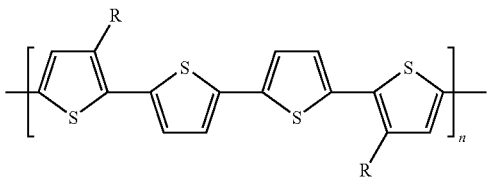

wherein R and R' are independently selected from hydrogen, alkyl or substituted alkyl containing from 1 to about 20 carbon atoms, a heteroatom-comprising group, and halogen; and n is a integer from about 3 to about 200.

In more specific embodiments, the semiconducting polymer is (A)

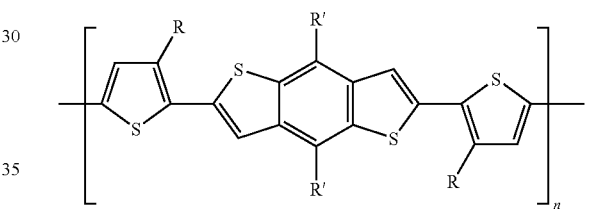

wherein R and R' are independently selected from alkyl or substituted alkyl containing from 1 to about 20 carbon atoms, a heteroatom-comprising group, and halogen; and n is a integer from about 3 to about 200.

The insulating polymer may be selected from the group consisting of polystyrene, poly(α-methylstyrene), poly(4-vinyl biphenyl), poly(vinyl cinnamate), and polysiloxane. In addition, insulating polymers having a higher molecular weight may also improve processing characteristics of the semiconducting layer by modifying its viscosity. In embodiments, the insulating polymer has a weight average molecular weight of at least 2,000. In further embodiments, the insulating polymer has a weight average molecular weight of from about 5,000 to about 1,000,000. In yet other embodiments, the insulating polymer has a weight average molecular weight of 100,000 or greater.

Generally speaking, the semiconducting layer contains more semiconducting polymer than insulating polymer. In some embodiments, the insulating polymer comprises from about 0.1 to about 60 percent by weight of the semiconducting layer, based on the total weight of the semiconducting layer, including from about 0.1 to about 20 percent. It is believed, though this application should not be construed as being limited by this theory, that the insulating polymer also provides better film quality to the semiconducting layer. In other embodiments, the semiconducting layer is substantially homogenous. In other words, its composition is the same throughout its depth, length, and width.

In a specific embodiment, the insulating polymer is polystyrene and the semiconducting polymer has the structure of

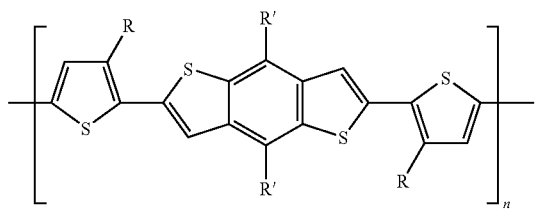

wherein R and R' are independently selected from alkyl or substituted alkyl containing from 1 to about 20 carbon atoms, a heteroatom-comprising group, and halogen; and n is a integer from about 3 to about 50. Exemplary heteroatom-comprising groups include alkoxy, cyano, nitro, thienylene, siloxy, and amino groups.

In some embodiments, the semiconducting layer may be formed by deposition of a semiconductor composition comprising a solvent, a crystalline semiconducting polymer, and an amorphous insulating polymer. The crystalline semiconducting polymer comprises from about 0.1 to about 5 percent by weight of the composition, preferably from about 0.1 to about 1 percent by weight of the composition. The amorphous insulating polymer comprises from about 0.01 to about 2.5 percent by weight of the composition, including from about 0.01 to about 1 percent by weight, or from about 0.02 to about 0.5 percent by weight of the composition. The composition has a viscosity of from about 1.5 centipoise to about 20 centipoise, including from about 2 centipoise to about 12 centipoise. The semiconductor composition usually has a low viscosity due to the use of low concentrations of semiconducting polymer. For printing or coating applications, a certain viscosity, for example at least 2 or at least 5 centipoise, is required. The addition of insulating polymer, particularly high molecular weight insulating polymer, will increase the viscosity of semiconductor composition. In embodiments, the viscosity of the composition was enhanced by at least 50%, including at least 100%, compared to a similar composition lacking the insulating polymer. Any suitable solvent can be used to form the semiconductor composition. In embodiments, the solvent is selected from the group consisting of aromatic hydrocarbon such as toluene, xylene, mesitylene, chlorinated solvents such as dichloromethane, chloroform, chlorobenzene, dichlorobenzene, trichlorobenzene, chlorotoluene, and mixtures thereof.

The semiconducting layer may be from about 5 nm to about 1000 nm thick, preferably from about 10 nm to about 100 nm thick. The semiconducting layer can be formed by any suitable method. However, the semiconducting layer is generally formed from a liquid solution and then deposited onto the substrate of the transistor. Exemplary deposition methods include liquid deposition such as spin coating, dip coating, blade coating, rod coating, screen printing, stamping, ink jet printing, and the like, and other conventional processes known in the art. In particular embodiments for forming the semiconductor layer, no thermal annealing is performed on the semiconductor layer. This prevents phase separation of the semiconducting polymer and the insulating polymer composition, so a substantially homogeneous layer can be achieved. In further embodiments, the semiconducting polymer has a high melting point of greater than 100° C., greater than 180° C., or greater than 200° C. Thermal annealing upon other layers of the transistor has no effect on the morphology of the semiconductor layer.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about 10-12 Siemens per centimeter (S/cm). The dielectric layer is formed using conventional processes known in the art, including those processes described in forming the gate electrode.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The resulting TFT has improved mobility, flexibility, threshold voltage, and saturation behavior. In embodiments, the transistor has a mobility of 0.25 cm$^2$/V·sec or greater. In further embodiments, the transistor has a threshold voltage of −10 V or greater. In additional embodiments, the transistor has both a mobility of 0.25 cm$^2$/V·sec or greater and a threshold voltage of −10 V or greater. In some embodiments, the transistor has a field effect mobility at least 10% higher than a transistor having the same semiconducting polymer but lacking the insulating polymer; in additional embodiments, the mobility is at least 25% higher.

The flexibility of the semiconducting layer may also be improved by the addition of the insulating polymer. Crystalline semiconducting polymers may be too brittle to withstand the extensive bending and unbending stresses present in flexible OTFT devices. The insulating polymer, particularly if it is amorphous, would improve the flexibility of the semiconducting layer. This improvement in flexibility can be measured by the yield point elongation of the semiconducting layer. In specific embodiments, the semiconducting layer has a yield point elongation at least 10% greater or at least 20% greater, than a semiconducting layer having the same semiconducting polymer but lacking the insulating polymer. In other embodiments, the semiconducting layer has a yield point elongation equal to or greater than the yield point elongation of the gate dielectric layer. In still other embodiments, the semiconducting layer has a yield point elongation of from about 1% to about 25%, or from about 2% to about 10%.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The semiconducting polymer formed by the methods of the present disclosure may be deposited onto any appropriate component of an organic thin-film transistor to form a semiconducting layer of that transistor.

The following examples illustrate an OTFT made according to the methods of the present disclosure. The examples are merely illustrative and are not intended to limit the present disclosure with regard to the materials, conditions, or process parameters set forth therein. All parts are percentages by weight unless otherwise indicated.

EXAMPLE

An n-doped silicon wafer with 200 nm silicon oxide was used as the substrate to fabricate OTFT devices, wherein the n-doped silicon functioned as the gate electrode and the silicon oxide as gate dielectric layer. The wafer surface was modified with a SAM silane interfacial layer by immersing the plasma-cleaned wafer into a 0.1M dodecyltrichlorosilane solution in toluene at 60° C. for 20 min.

A semiconductor solution was prepared by dissolving 10 mg PBTBT-12 and 1 mg polystyrene (Mw=280,000) in 1 g dichlorobenzene with heating. PBTBT-12 has the chemical structure shown below.

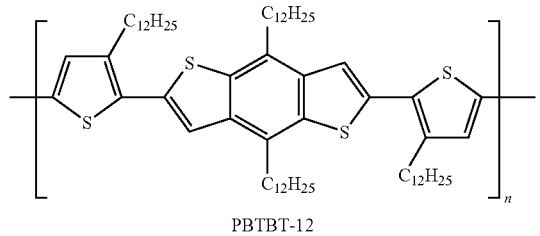

PBTBT-12

After filtering through a 0.45 μm syringe filter, the semiconductor solution was spin coated onto the above-modified wafer substrate at 1000 rpm for 90 seconds. After drying the solvent, gold source/drain electrodes were evaporated through a shadow mask on top of the semiconducting layer to complete the OTFT devices. For comparison, control devices without the polystyrene component were also made in a similar manner.

The devices were characterized with a Keithley 4200-SCS instrument at ambient conditions in the dark. The devices with polystyrene additive showed a higher on-current and better saturation behavior. Mobility and threshold voltage data were extracted from transfer curves for more than 10 transistors and summarized in Table 1. Generally, the devices with polystyrene additive in the semiconducting layer showed a much higher mobility and smaller threshold voltages compared to the device without polystyrene.

TABLE 1

| Amount of polystyrene | Mobility range (cm$^2$/V · sec) | Average Mobility (cm$^2$/V · sec) | Threshold Voltage (V) |
|---|---|---|---|
| None | 0.18-0.24 | 0.22 | −11 |
| 10 wt % | 0.25-0.34 | 0.28 | −6 |

Accordingly, the performance of polymeric semiconductor, particularly the highly crystalline PBTBT, was improved by addition of a small amount of insulating polystyrene.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin-film transistor having improved mobility and flexibility, comprising
   a gate dielectric layer; and
   a semiconducting layer, wherein the semiconducting layer comprises a semiconducting polymer and an insulating polymer;

wherein the semiconducting polymer is selected from the group consisting of polymers A to C:

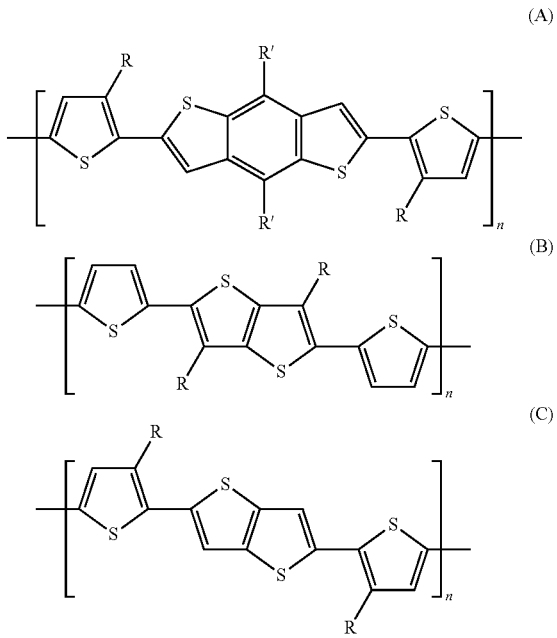

wherein R and R' are independently selected from hydrogen, alkyl or substituted alkyl containing from 1 to about 20 carbon atoms, a heteroatom-comprising group, and halogen; and n is a integer from about 3 to about 200.

2. The transistor of claim 1, wherein the semiconducting polymer has a crystallinity of greater than 50 percent.

3. The transistor of claim 1, wherein the semiconducting polymer has a melting point of 100° C. or higher.

4. The transistor of claim 1, wherein the semiconducting polymer has a melting point of 200° C. or higher.

5. The transistor of claim 1, wherein the insulating polymer is selected from the group consisting of polystyrene, poly(α-methylstyrene), poly(4-vinyl biphenyl), poly(vinyl cinnamate), and polysiloxane.

6. The transistor of claim 1, wherein the insulating polymer is an amorphous polymer having a weight average molecular weight of at least 2,000 g/mol.

7. The transistor of claim 1, wherein the insulating polymer has a weight average molecular weight of from about 5,000 to about 1,000,000 g/mol.

8. The transistor of claim 1, wherein the insulating polymer comprises from about 0.1 to about 60 percent by weight of the semiconducting layer.

9. The transistor of claim 1, wherein the insulating polymer comprises from about 0.1 to about 20 percent by weight of the semiconducting layer.

10. The transistor of claim 1, wherein the semiconducting layer is substantially homogeneous.

11. The transistor of claim 1, wherein the transistor has a field effect mobility at least 10% higher than a transistor having the same semiconducting polymer but lacking the insulating polymer.

12. The transistor of claim 1, wherein the transistor has a field effect mobility at least 25% higher than a transistor having the same semiconducting polymer but lacking the insulating polymer.

13. The transistor of claim 1, wherein the transistor has a threshold voltage of −10 V or greater.

14. The transistor of claim 1, wherein the semiconducting layer has a yield point elongation at least 10% greater compared to a semiconducting layer having the same semiconducting polymer but lacking the insulating polymer.

15. The transistor of claim 1, wherein the semiconducting layer has a yield point elongation equal to or greater than the yield point elongation of the gate dielectric layer.

16. The transistor of claim 1, wherein the semiconducting layer has a yield point elongation of from about 1% to about 25%.

17. A thin-film transistor having improved mobility and flexibility, comprising
a gate dielectric layer; and
a substantially homogeneous semiconducting layer comprising a semiconducting polymer and an insulating polymer;
wherein the semiconducting polymer has the formula of polymer A:

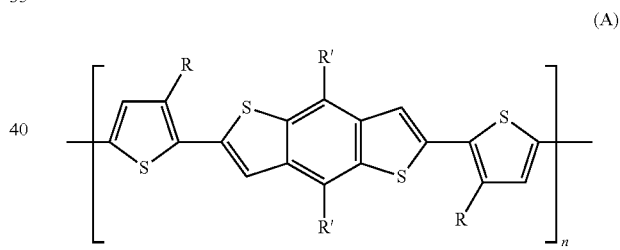

wherein R and R' are independently selected from hydrogen, alkyl or substituted alkyl containing from 1 to about 20 carbon atoms, a heteroatom-comprising group, and halogen; and n is a integer from about 3 to about 200; and
wherein the insulating polymer is polystyrene having a molecular weight of 100,000 grams per mole or greater.

* * * * *